(12) United States Patent
Hara et al.

(10) Patent No.: US 12,573,598 B2
(45) Date of Patent: Mar. 10, 2026

(54) WAFER PLACEMENT TABLE

(71) Applicant: NGK INSULATORS, LTD., Nagoya-City (JP)

(72) Inventors: Tomohiro Hara, Handa-City (JP); Yutaka Unno, Handa-City (JP)

(73) Assignee: NGK INSULATORS, LTD., Nagoya (JP)

( * ) Notice: Subject to any disclaimer, the term of this patent is extended or adjusted under 35 U.S.C. 154(b) by 463 days.

(21) Appl. No.: 18/332,922

(22) Filed: Jun. 12, 2023

(65) Prior Publication Data

US 2024/0242943 A1 Jul. 18, 2024

Related U.S. Application Data

(63) Continuation of application No. PCT/JP2023/000526, filed on Jan. 12, 2023.

(51) Int. Cl.
*H01J 37/32* (2006.01)

(52) U.S. Cl.
CPC .. *H01J 37/32724* (2013.01); *H01J 37/32532* (2013.01); *H01J 37/32541* (2013.01);
(Continued)

(58) Field of Classification Search
CPC ........................ H01J 37/32715; H01L 21/6833
See application file for complete search history.

(56) References Cited

U.S. PATENT DOCUMENTS

| | | | | | |
|---|---|---|---|---|---|
| 5,968,379 | A | * | 10/1999 | Zhao | ............... C23C 16/4586 |
| | | | | | 219/121.52 |
| 2003/0051665 | A1 | * | 3/2003 | Zhao | ............... C23C 16/5096 |
| | | | | | 712/42 |

(Continued)

FOREIGN PATENT DOCUMENTS

| | | | |
|---|---|---|---|
| JP | 2010-258428 | A | 11/2010 |
| JP | 2012-089694 | A | 5/2012 |

(Continued)

OTHER PUBLICATIONS

English translation of the International Preliminary Report on Patentability (Chapter I) dated Jul. 24, 2025 (Application No. PCT/JP2023/000526).

(Continued)

*Primary Examiner* — Scott W Dodds
(74) *Attorney, Agent, or Firm* — BURR PATENT LAW, PLLC

(57) ABSTRACT

A wafer placement table includes a ceramic plate that has a wafer placement surface, a first RF electrode that is circular and that is embedded in the ceramic plate, a first RF terminal that is electrically connected to the first RF electrode, a second RF electrode that is annular and that is positioned at an outer side of the first RF electrode in plan view, and that is embedded in the ceramic plate at a different depth from the first RF electrode, a second RF terminal that is electrically connected to the second RF electrode and a connection circuit that connects the second RF terminal and the second RF electrode. The connection circuit is formed of electroconductive wires that are in a mesh-patterned form or in a radial form. A width of the electroconductive wires becomes broader from the second RF electrode toward the second RF terminal.

5 Claims, 8 Drawing Sheets

(52) U.S. Cl.
CPC .. *H01J 37/32568* (2013.01); *H01J 37/32577* (2013.01); *H01J 37/32715* (2013.01); *H01J 2237/3321* (2013.01)

(56) References Cited

U.S. PATENT DOCUMENTS

| | | | |
|---|---|---|---|
| 2005/0241765 A1* | 11/2005 | Dhindsa | H01J 37/3244 156/345.37 |
| 2013/0340937 A1 | 12/2013 | Yamazawa et al. | |
| 2014/0231019 A1 | 8/2014 | Kajihara | |
| 2018/0025931 A1 | 1/2018 | Nemani et al. | |
| 2020/0118844 A1 | 4/2020 | Willwerth et al. | |
| 2020/0340102 A1 | 10/2020 | Kimura et al. | |
| 2023/0326779 A1* | 10/2023 | Jung | H01L 21/6833 |

FOREIGN PATENT DOCUMENTS

| | | |
|---|---|---|
| JP | 5583877 B1 | 9/2014 |
| JP | 2019-522374 A | 8/2019 |
| JP | 2022-534141 A | 7/2022 |
| WO | 2014/073554 A1 | 5/2014 |
| WO | 2018/179891 A1 | 10/2018 |

OTHER PUBLICATIONS

International Search Report and Written Opinion (Application No. PCT/JP2023/000526) dated Feb. 21, 2023.

\* cited by examiner

WAFER PLACEMENT TABLE

BACKGROUND OF THE INVENTION

1. Field of the Invention

The present invention relates to a wafer placement table.

2. Description of the Related Art

There conventionally is known a wafer placement table in which two RF electrodes are embedded in a ceramic plate at different depths. For example, PTL 1 discloses a wafer placement table including, as two RF electrodes, a first RF electrode that is circular, and a second RF electrode that is annular and that is positioned on an outer side of the first RF electrode in plan view. The second RF electrode is connected to an external terminal provided near the center of a ceramic plate, via a connection circuit formed of electroconductive lines that are in a radial form. PTL 2 uses, as a connection circuit, an electroconductive plate that has a plurality of holes of which an opening form is hexagonal or triangular. Portions of the electroconductive plate that surround the holes are equivalent to electroconductive lines.

CITATION LIST

Patent Literature

PTL 1: JP 2012-89694 A
PTL 2: JP 5583877 B

SUMMARY OF THE INVENTION

However, the width of the electroconductive lines is constant in PTLs 1 and 2, and accordingly there have been problems in that temperature difference within a wafer placement surface becomes great, or plasma not being able to be efficiently generated above the wafer placement surface.

The present invention has been made to solve the above-described problems, and accordingly it is a primary object thereof to reduce temperature difference within the wafer placement surface, and efficiently generate plasma.

[1] A wafer placement table according to the present invention includes a ceramic plate that has a wafer placement surface at an upper face thereof, a first RF electrode that is circular and that is embedded in the ceramic plate, a first RF terminal that is electrically connected to the first RF electrode, a second RF electrode that is annular and that is positioned at an outer side of the first RF electrode in plan view, and that is embedded in the ceramic plate at a different depth from the first RF electrode, a second RF terminal that is electrically connected to the second RF electrode, and a connection circuit that connects the second RF terminal and the second RF electrode, wherein the connection circuit is formed of electroconductive wires that are in a mesh-patterned form or in a radial form, and a width of the electroconductive wires becomes broader from the second RF electrode toward the second RF terminal.

In this wafer placement table, the connection circuit connecting the second RF terminal and the second RF electrode is formed of the electroconductive wires that are in a mesh-patterned form or in a radial form, and the width of the electroconductive wires becomes broader from the second RF electrode toward the second RF terminal. That is to say, the width of the electroconductive wires is narrow at a portion of connection to the second RF electrode and is broad at a portion of connection to the second RF terminal. Accordingly, heat generation of the electroconductive wires forming the connection circuit can be suppressed as compared to a case in which the width of the electroconductive wires is constant at a narrow value. As a result, temperature difference within the wafer placement surface can be reduced. Also, an area of overlap of the first RF electrode and the connection circuit in plan view is smaller in comparison with a case in which the width of the electroconductive wires of the connection circuit is constant at a broad value, and plasma coupling between the first RF electrode and the connection circuit is reduced. As a result, plasma can be generated above the wafer placement surface with good efficiency.

Note that in the present specification, the present invention may be described using up-down, left-right, front-rear, and so forth, but up-down, left-right, and front-rear are merely relative positional relations. Accordingly, when orientation of the wafer placement table is changed, the up-down may become the left-right, and the left-right may become the up-down, and such cases are encompassed by the technical scope of the present invention as well. Also, the width of the electroconductive wires may become broader stepwise from the second RF electrode toward the second RF terminal, or may gradually become broader.

[2] In the wafer placement table according to the present invention (the wafer placement table according to the above [1]), the second RF terminal may be provided at the center of the ceramic plate. Accordingly, a balanced layout of the electroconductive wires forming the connection circuit can be easily made.

[3] In the wafer placement table according to the present invention (the wafer placement table according to the above [1] or [2]), the width of the electroconductive wires may become broader from the second RF electrode toward the second RF terminal, within a range of no less than 5 mm and no more than 15 mm. Accordingly, the area of overlap between the first RF electrode and the connection circuit in plan view can be appropriately reduced while appropriately suppressing heat generation of the connection circuit.

[4] In the wafer placement table according to the present invention (the wafer placement table according to any one of the above [1] to [3]), the connection circuit is formed of the electroconductive wires that are in a mesh-patterned form, and has apertures that are polygonal. Accordingly, the average temperature of the wafer placement surface can be more readily brought near to a target temperature of the wafer placement surface. Note that examples of polygons include hexagons, squares, triangles, and so forth.

[5] In the wafer placement table according to the present invention (the wafer placement table according to the above [4]), the width of innermost line segments that are connected to the second RF terminal, out of the electroconductive wires, may be broadest, and the width of line segments next closest to the second RF terminal after the innermost line segments, out of the electroconductive wires, may be next broadest. Accordingly, the connection circuit having the apertures that are polygonal can be relatively easily designed such that the width becomes broader from the second RF electrode toward the second RF terminal.

DETAILED DESCRIPTION OF THE INVENTION

Figure 1:
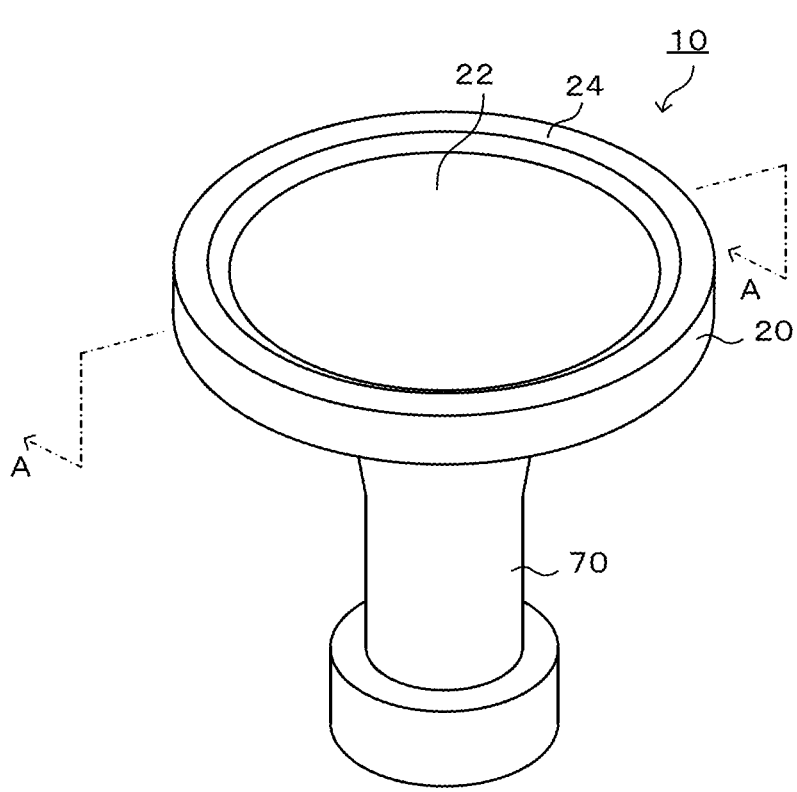
FIG. 1 is a perspective view of a wafer placement table 10.
Figure 2:
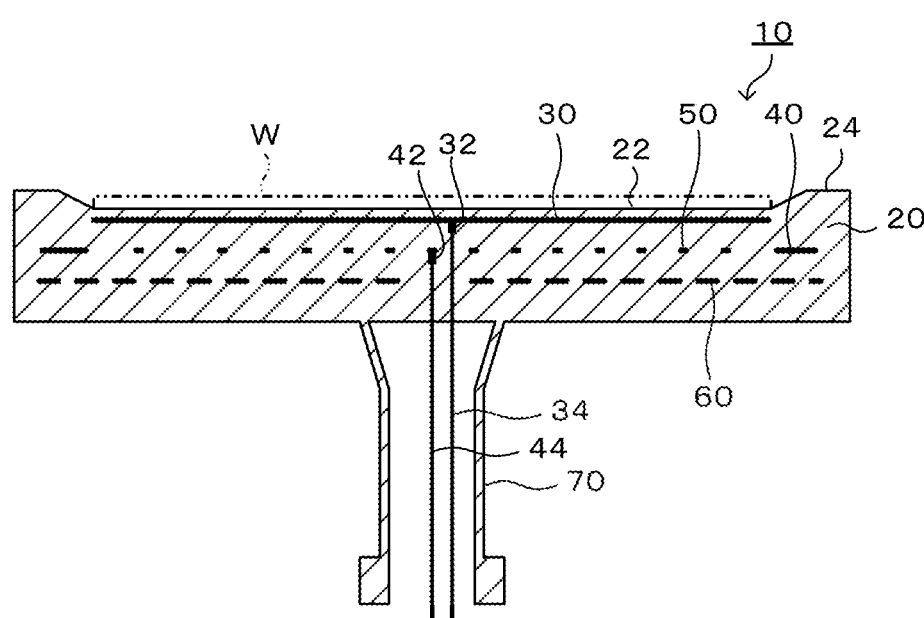
FIG. 2 is a cross-sectional view along A-A in FIG. 1.
Figure 3:
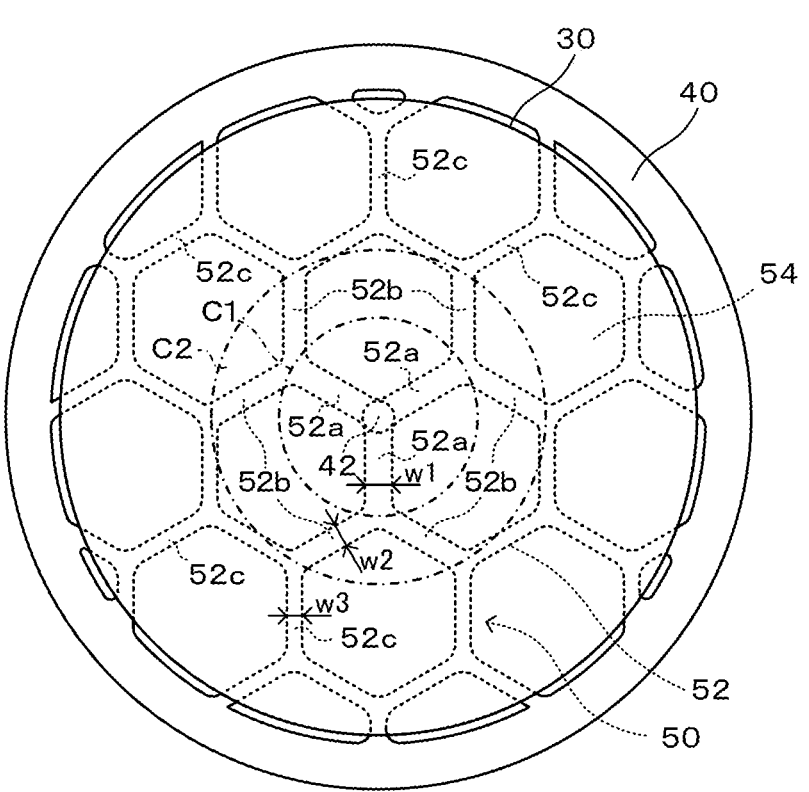
FIG. 3 is an explanatory diagram of a first RF electrode 30 and a second RF electrode 40 regarding which a connection circuit 50 is provided on an inner side thereof in plan view.
Figure 4:
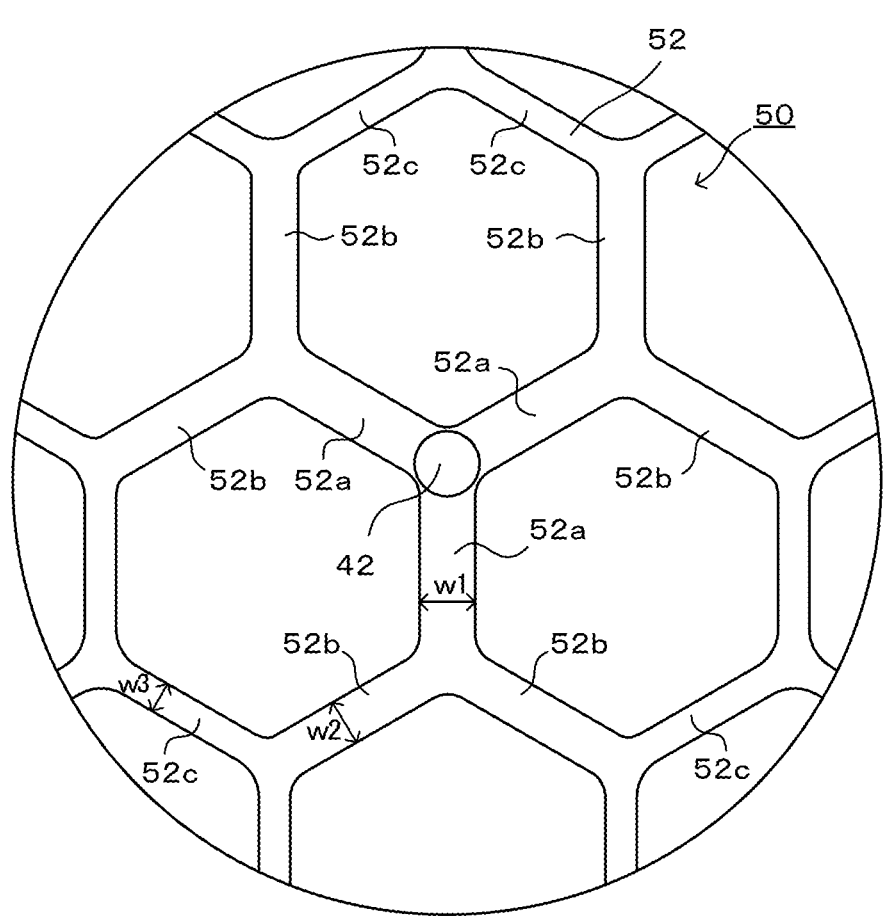
FIG. 4 is a partial enlarged view of the connection circuit 50.

A preferred embodiment of the present invention will be described below with reference to the drawings. FIG. 1 is a perspective view of a wafer placement table 10, FIG. 2 is a cross-sectional view along A-A in FIG. 1, FIG. 3 is an explanatory diagram of a first RF electrode 30 and a second RF electrode 40 regarding which a connection circuit 50 is provided on an inner side thereof in plan view, and FIG. 4 is a partial enlarged view of the connection circuit 50.

The wafer placement table 10 is used as a part of an apparatus for manufacturing semiconductor device and so forth, and examples thereof include an electrostatic chuck, a ceramic heater, and so forth. The wafer placement table 10 includes a ceramic plate 20 and a shaft 70.

The ceramic plate 20 is a disc-like plate that is made of a ceramic material of which aluminum nitride, alumina, and so forth are representative, and has a wafer placement surface 22 that is circular on an upper face thereof, and a protrusion 24 that is annular. The diameter of the ceramic plate 20 is approximately 330 mm, for example, and the thickness thereof is approximately 20 mm, for example. The diameter of the wafer placement surface 22 is approximately 300 mm, for example, and generally matches the diameter of a wafer W. The protrusion 24 that is annular is provided so as to surround the wafer placement surface 22 and to be one level higher than the wafer placement surface 22. The first RF electrode 30, the second RF electrode 40, and a heater electrode 60, are embedded in the ceramic plate 20, in order from a side closer to the wafer placement surface 22.

The first RF electrode 30 is a metal mesh that is circular, of which Mo mesh, W mesh, and so forth are representative. The center of the first RF electrode 30 matches the center of the ceramic plate 20. The diameter of the first RF electrode 30 is, for example, approximately 300 mm. The first RF electrode 30 is electrically connected to a first RF terminal 32 near the center of the ceramic plate 20. The first RF electrode 30 is connected to a first power feeder rod 34 via the first RF terminal 32. The first power feeder rod 34 passes through the second RF electrode 40 and the heater electrode 60 in a state of not coming into contact therewith, passes through the inside of the shaft 70, and reaches the outside of the shaft 70.

The second RF electrode 40 is embedded in the ceramic plate 20 at a different depth from the first RF electrode 30. The second RF electrode 40 is a metal mesh that is annular, of which Mo mesh, W mesh, and so forth are representative. The center of the second RF electrode 40 matches the center of the ceramic plate 20. The inner diameter of the second RF electrode 40 is the same as or slightly larger than the diameter of the first RF electrode 30, and the outer diameter is, for example, approximately 315 mm. The second RF electrode 40 is electrically connected to a second RF terminal 42 provided at the center of the ceramic plate 20 via the connection circuit 50. The second RF electrode 40 is connected to a second power feeder rod 44 via the second RF terminal 42. The second power feeder rod 44 passes through the heater electrode 60 in a state of not coming into contact therewith, passes through the inside of the shaft 70, and reaches the outside of the shaft 70.

The connection circuit 50 is provided in the ceramic plate 20 at the same depth as the second RF electrode 40. The connection circuit 50 is provided on the inner side of the second RF electrode 40. The connection circuit 50 is formed of electroconductive wires 52 that are in a mesh-patterned form, and has apertures 54 that are hexagonal. The center of the connection circuit 50 matches the center of the ceramic plate 20, and is electrically connected to the second RF terminal 42. Electroconductive materials with high melting points, such as Mo, W, Nb, and so forth, are preferably used as the material of the electroconductive wires 52. The connection circuit 50 can be formed by printing a paste containing such electroconductive materials with high melting points.

A width of the electroconductive wires 52 increases from the second RF electrode 40 that is annular toward the second RF terminal 42. In the present embodiment, the width of the electroconductive wires 52 is decided as follows. That is to say, a hypothetical small circle C1 and a hypothetical large circle C2 are drawn concentrically with the ceramic plate 20 in plan view. The radius of the hypothetical small circle C1 is generally the same as the length of the sides of the hexagons making up the apertures 54, and the radius of the hypothetical large circle C2 is generally the same as the length of diagonal lines (diagonal lines that do not pass through the center) of the hexagons making up the apertures 54. At this time, out of the electroconductive wires 52, a width w1 of those positioned on an inner side of the hypothetical small circle C1 (three electroconductive wires 52a) is the largest, a width w2 of those positioned on the outer side of the hypothetical small circle C1 and on an inner side of the hypothetical large circle C2 (six electroconductive wires 52b) is next largest, and a width w3 of those positioned on an outer side of the hypothetical large circle C2 (the other electroconductive wires 52c) is the smallest. This is w1>w2>w3 when expressed in an Expression. In other words, the width w1 of innermost line segments connected to the second RF terminal 42 (electroconductive wires 52a) out of the electroconductive wires 52 is the broadest, the width w2 of line segments next closest to the second RF terminal 42 (electroconductive wires 52b) after the innermost line segments out of the electroconductive wires 52 is next broadest, and the width of the other electroconductive wires 52c is the narrowest. In this way, the width of the electroconductive wires 52 becomes broader stepwise from the second RF electrode 40 that is annular toward the second RF terminal 42.

The width of the electroconductive wires 52 preferably becomes broader from the second RF electrode 40 toward the second RF terminal 42 within a range of no less than 5 mm and no more than 15 mm. For example, w3=5 mm, w2=10 mm, and w1=15 mm may be set, w3=6 mm, w2=8 mm, and w1=10 mm may be set, or w3=6 mm, w2=7 mm, and w1=8 mm may be set.

The heater electrode 60 is formed laid out starting from one end arranged near the middle of the ceramic plate 20 to almost all regions of the ceramic plate 20 in a one-stroke pattern in plan view, and then reaching the other end arranged near the middle. Electroconductive materials with high melting points, such as Mo, W, Nb, and so forth, are preferably used as the material of the heater electrode 60. Note that power feeder rods are connected to each of the one end and the other end of the heater electrode 60, although omitted from illustration, and each power feeder rod passes through the inside of the shaft 70 and is connected to a heater electric power source. The heater electrode 60 may be provided in a plurality of stages, above and below.

The shaft 70 is a cylindrical member fabricated from the same material as the ceramic plate 20. An upper end of the shaft 70 is joined to a lower face of the ceramic plate 20 (the face on the opposite side from the wafer placement surface 22).

Such a wafer placement table 10 can be manufactured in accordance with a manufacturing example described in PTL 2, for example.

Figure 5:
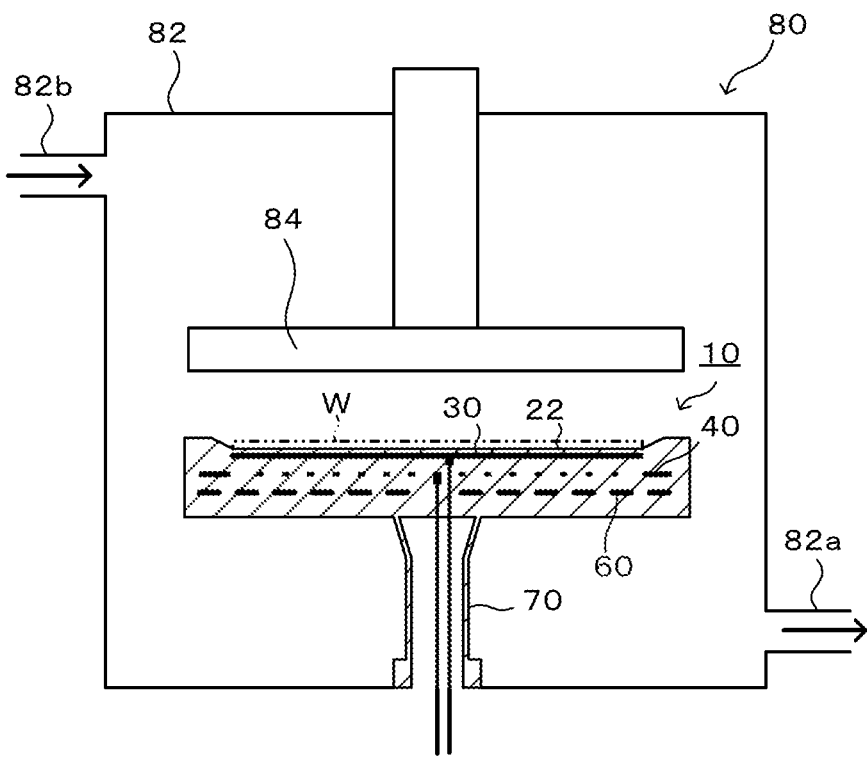
FIG. 5 is a schematic explanatory diagram of a plasma-enhanced chemical vapor deposition device 80 on which the wafer placement table 10 is installed.

Next, an example of the use of a wafer placement table 10 will be described. FIG. 5 is a schematic view of a plasma-enhanced chemical vapor deposition apparatus 80 in which a wafer placement table 10 is installed. A wafer placement table 10 having a wafer-placing surface 22 on which a wafer W is placed is installed in the interior of a chamber 82 of the plasma-enhanced chemical vapor deposition apparatus 80. Specifically, the lower end of the shaft 70 is installed on the floor of the chamber 82 in an airtight manner. This isolates the interior of the shaft 70 from the interior of the chamber 82. A counter electrode 84 is disposed on the ceiling of the chamber 82 at a position opposite the wafer placement table 10. The heater electrode 60 is supplied with electrical power to heat the wafer W placed on the wafer placement table 10 to a predetermined temperature. At the same time, the interior of the chamber 82 is evacuated to a predetermined degree of vacuum by a vacuum pump connected to a gas outlet 82a of the chamber 82. Thereafter, a source gas for forming a desired film is introduced through a gas inlet 82b of the chamber 82 and is controlled so that the internal pressure of the chamber 82 reaches a predetermined pressure. Different radio-frequency electrical powers are supplied between the first RF electrode 30 and the counter electrode 84 and between the second RF electrode 40 and the counter electrode 84. This generates a plasma between the counter electrode 84 and the wafer placement table 10, thus forming a desired thin film on the surface of the wafer W.

In the wafer placement table 10 described above, the connection circuit 50 connecting the second RF terminal 42 and the second RF electrode 40 is formed of the electroconductive wires 52 (52a to 52c) in a mesh-patterned form, and the width of the electroconductive wires 52 becomes broader from the second RF electrode 40 toward the second RF terminal 42. That is to say, the width of the electroconductive wires 52 is narrow at a portion of connection to the second RF electrode 40 and is broad at a portion of connection to the second RF terminal 42. Accordingly, heat generation of the electroconductive wires 52 forming the connection circuit 50 can be suppressed as compared to a case in which the width of the electroconductive wires 52 of the connection circuit 50 is constant at a narrow value (e.g., the width of the electroconductive wires 52 is constant at the width w3, as in FIG. 6). As a result, temperature difference within the wafer placement surface 22 can be reduced. Also, an area of overlap of the first RF electrode 30 and the connection circuit 50 in plan view is smaller in comparison with a case in which the width of the electroconductive wires 52 of the connection circuit 50 is constant at a broad value (e.g., the width of the electroconductive wires 52 is constant at the width w1, as in FIG. 7), and plasma coupling between the first RF electrode 30 and the connection circuit 50 is reduced. As a result, plasma can be generated above the wafer placement surface 22 with good efficiency.

Also, the second RF terminal 42 is provided at the center of the ceramic plate 20. Accordingly, a balanced layout of the electroconductive wires 52 forming the connection circuit 50 can be easily made. Specifically, the connection circuit 50 can be easily formed to be substantially rotationally symmetrical, with the center of the ceramic plate 20 as an axis.

Further, the width of the electroconductive wires 52 (52a to 52c) preferably becomes broader from the second RF electrode 40 toward the second RF terminal 42 within the range of no less than 5 mm and no more than 15 mm. Accordingly, the area of overlap between the first RF electrode 30 and the connection circuit 50 in plan view can be appropriately reduced while appropriately suppressing heat generation of the connection circuit 50.

Furthermore, the connection circuit 50 has apertures 54 that are polygonal (hexagonal). Accordingly, the average temperature of the wafer placement surface 22 can be more readily brought near to a target temperature of the wafer placement surface 22. This point will be described by way of Examples below.

Moreover, the width w1 of innermost line segments that are connected to the second RF terminal 42 (electroconductive wires 52a), out of the electroconductive wires 52, is broadest, and the width w2 of line segments next closest to the second RF terminal 42 (electroconductive wires 52b) after the innermost line segments, out of the electroconductive wires 52, is next broadest. Accordingly, the connection circuit 50 having the apertures 54 that are hexagonal can be relatively easily designed such that the width becomes broader from the second RF electrode 40 toward the second RF terminal 42.

It is needless to say that the present invention is not limited to the above-described embodiment whatsoever, and can be carried out in various forms, as long as such forms are within the technical scope of the present invention.

Figure 8:
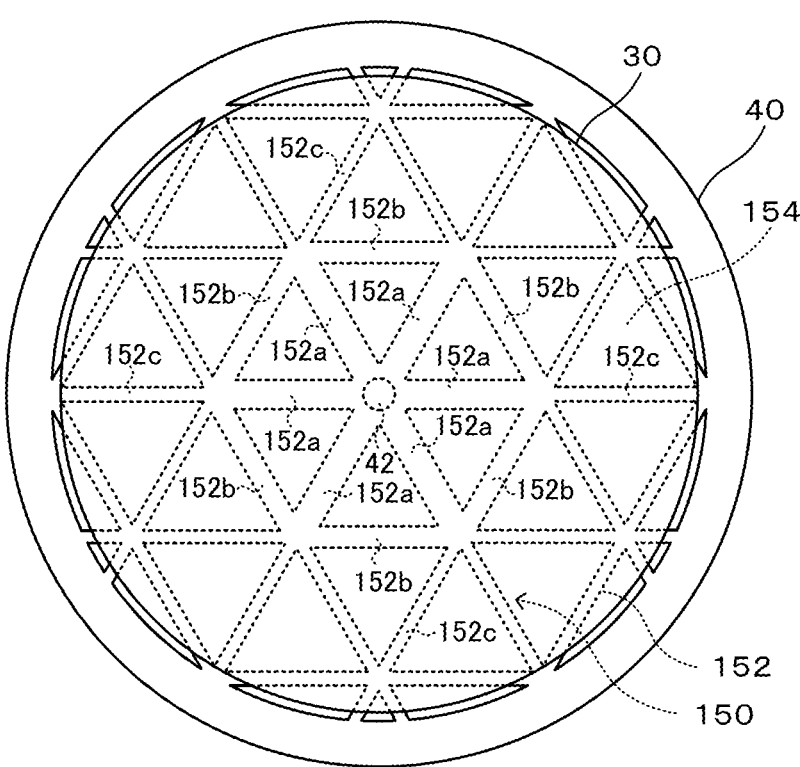
FIG. 8 is an explanatory diagram of an embodiment of a connection circuit 150.

In the above-described embodiment, the connection circuit 50 has apertures 54 that are hexagonal, but the apertures may be other polygons besides hexagons. FIG. 8 is an example of a connection circuit 150 that has apertures 154 that are triangular. The connection circuit 150 is a circuit that connects the second RF terminal 42 and the second RF electrode 40, and overlaps the first RF electrode 30 in plan view. A width of electroconductive wires 152 forming the connection circuit 150 becomes broader from the second RF electrode 40 that is annular toward the second RF terminal 42. Specifically, the width of innermost line segments connected to the second RF terminal 42 (electroconductive wires 152a) out of the electroconductive wires 152 is the broadest, the width of line segments next closest to the second RF terminal 42 (electroconductive wires 152b) after the innermost line segments out of the electroconductive wires 152 is next broadest, and the width of the other electroconductive wires 152c is the narrowest.

Figure 9:
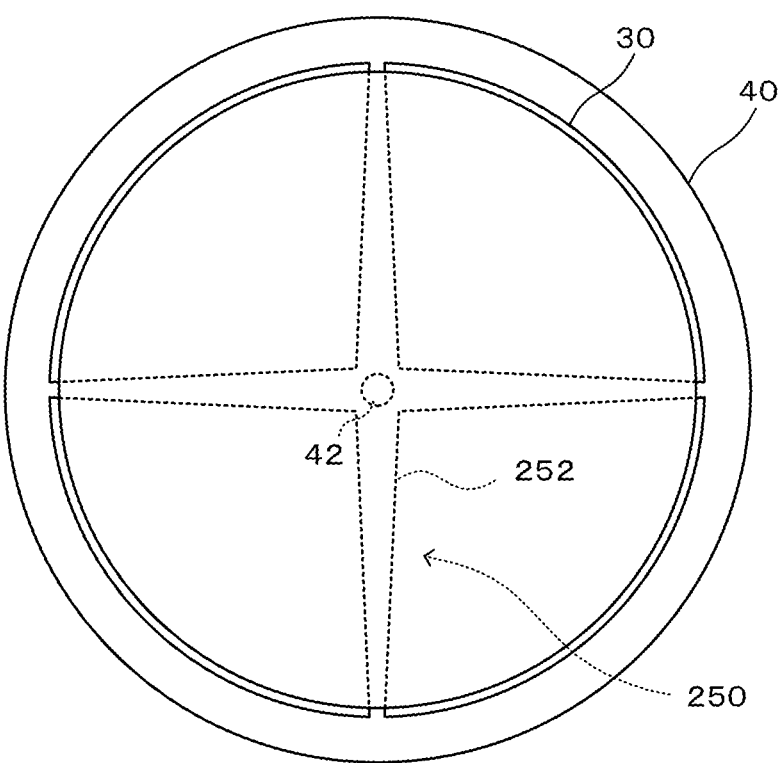
FIG. 9 is an explanatory diagram of an embodiment of a connection circuit 250.

In the above-described embodiment, the connection circuit 50 is formed of the electroconductive wires 52 in a mesh-patterned form, but may be formed of electroconductive wires in a radial form. FIG. 9 is an example of a connection circuit 250 formed of electroconductive wires 252 in a radial form. The connection circuit 250 is a circuit that connects the second RF terminal 42 and the second RF electrode 40, and overlaps the first RF electrode 30 in plan view. A width of the four electroconductive wires 252 forming the connection circuit 250 becomes broader from the second RF electrode 40 that is annular toward the second RF terminal 42. The width of the electroconductive wires 252 here gradually becomes broader, instead of stepwise. Note that the number of the electroconductive wires 252 in a radial form is not limited to four, and may be three, or five or more.

Although the width of the electroconductive wires 52 of the connection circuit 50 is set in three stages (w1, w2, w3) in the above-described embodiment, this is not restrictive in particular, and for example may be set in two stages, or may be set in four or more stages.

Although a circular electrode is employed as the first RF electrode 30 in the above-described embodiment, this is not restrictive in particular. For example, the first RF electrode 30 may be a pair of semicircle electrodes that are laid out with a gap therebetween to substantially be a circle. In this case, the pair of semicircle electrodes is configured such that the potential is the same when radio-frequency electric power is supplied thereto.

Although no electrostatic electrode is embedded in the ceramic plate 20 in the above-described embodiment, an electrostatic electrode may be embedded therein. Thus, the wafer W can be attracted to the wafer placement surface 22 by applying direct current voltage to the electrostatic electrode.

EXAMPLES

Examples and Comparative Examples will be described below, but the present invention is not limited by the following examples whatsoever.

Example 1

In Example 1, in the wafer placement table 10 in the embodiment described above (FIG. 1 to FIG. 4), w1=8 mm, w2=7 mm, and w3=6 mm were set. The difference between the highest temperature and the lowest temperature (hereinafter referred to as temperature difference) within the wafer placement surface 22 when grounding the second RF terminal 42 and inputting electric power of 2000 W to the second RF electrode 40 was then found. No electric power was supplied to the first RF electrode 30 or the heater electrode 60. Eighteen temperature measurement points on the wafer placement surface 22 were set in advance. As a result, the temperature difference was 44.3° C.

Separately from this, the target temperature of the wafer placement surface 22 was set to 300° C., and power feeding to the heater electrode 60 was controlled so that the temperature of the wafer placement surface 22 would be the target temperature. Along with this, the second RF terminal 42 was grounded and electric power of 2000 W was input to the second RF electrode 40. Also, electric power was not supplied to the first RF electrode 30. The average temperature of the wafer placement surface 22 at this time was found. The temperature measurement points were the same as above. As a result, the average temperature was 306.6° C.

Comparative Example 1

Figure 6:
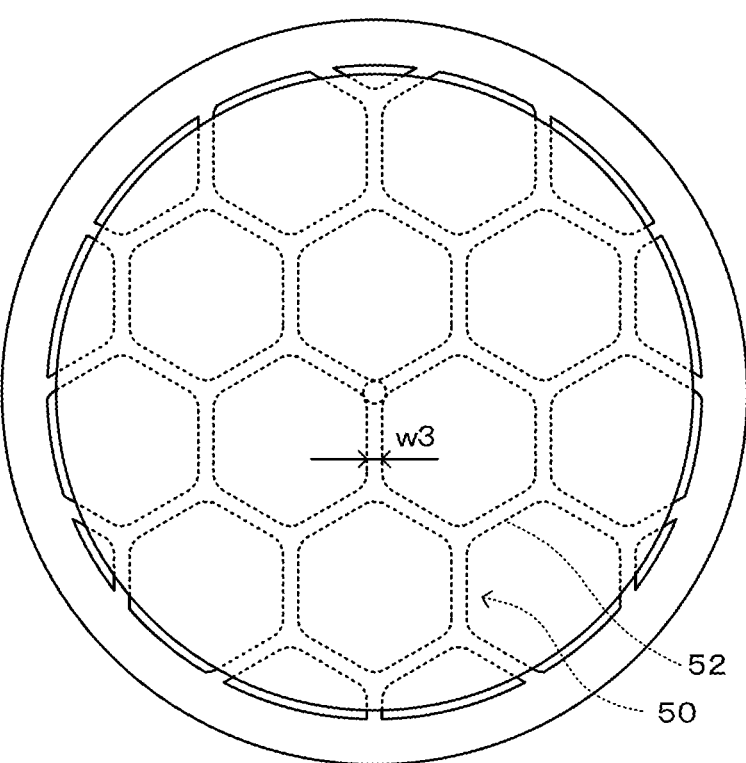
FIG. 6 is an explanatory diagram of a comparative form of the connection circuit 50.
Figure 7:
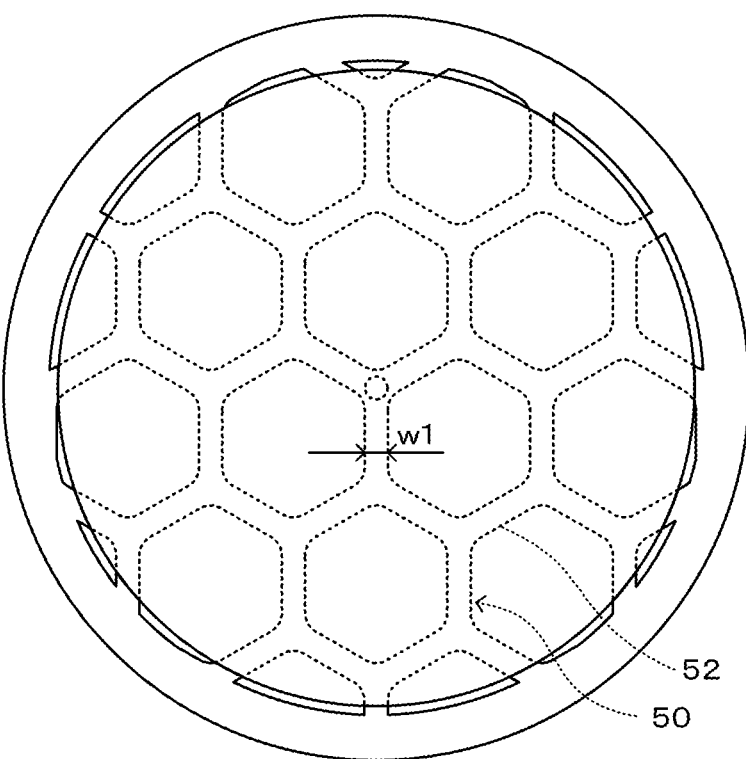
FIG. 7 is an explanatory diagram of a comparative form of the connection circuit 50.

In Comparative Example 1, the wafer placement table 10 was the same as that according to Example 1, other than employing FIG. 6 as the connection circuit 50, and setting the width w3 of the electroconductive wires 52 to be constant at 6 mm. The temperature difference and the average temperature were then found in the same way as in Example 1. As a result, the temperature difference was 58.0° C., and the average temperature was 307.4° C.

Example 2

In Example 2, in the wafer placement table 10 according to the above-described embodiment, the connection circuit 150 in FIG. 8 was used instead of the connection circuit 50, and the width of the electroconductive wires 152*a* was set to 8 mm, the width of the electroconductive wires 152*b* was set to 7 mm, and the width of the electroconductive wires 152*c* was set to 6 mm. The temperature difference and the average temperature were then found in the same way as in Example 1. As a result, the temperature difference was 20.4° C., and the average temperature was 310.6° C.

Comparative Example 2

Figure 10:
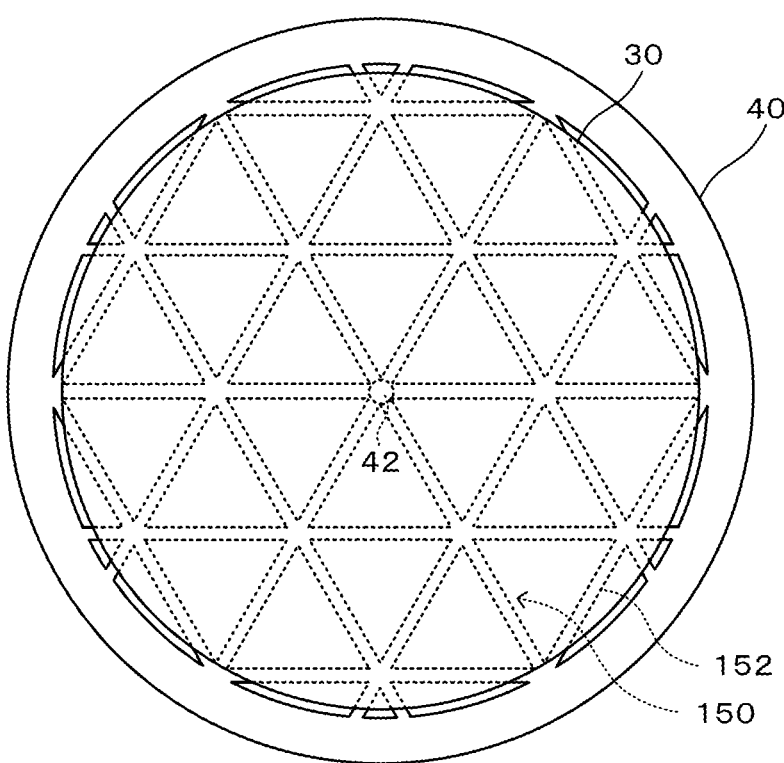
FIG. 10 is an explanatory diagram of a comparative form of the connection circuit 150.

In Comparative Example 2, the wafer placement table 10 was the same as that according to Example 2, other than employing FIG. 10 as the connection circuit 150, and setting the width of the electroconductive wires 152 to be constant at 6 mm. The temperature difference and the average temperature were then found in the same way as in Example 1. As a result, the temperature difference was 30.7° C., and the average temperature was 311.9° C.

Example 3

In Example 3, in the wafer placement table 10 according to the above-described embodiment, the connection circuit 250 in FIG. 9 was used instead of the connection circuit 50, the width of the electroconductive wires 252 was set to be 6 mm at the portion of connection to the second RF electrode 40, and 8 mm at the portion of connection to the second RF terminal 42. The temperature difference and the average temperature were then found in the same way as in Example 1. As a result, the temperature difference was 18.7° C., and the average temperature was 321.9° C.

Comparative Example 3

Figure 11:
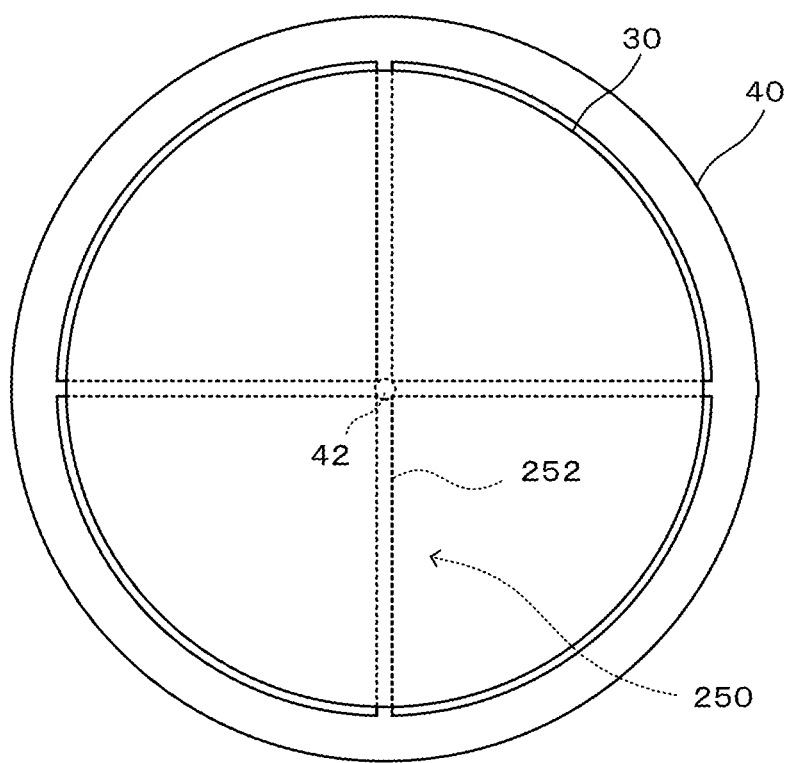
FIG. 11 is an explanatory diagram of a comparative form of the connection circuit 250.

In Comparative Example 3, the wafer placement table 10 was the same as that according to Example 3, other than employing FIG. 11 as the connection circuit 250, and setting the width of the electroconductive wires 252 to be constant at 6 mm. The temperature difference and the average temperature were then found in the same way as in Example 1. As a result, the temperature difference was 22.1° C., and the average temperature was 324.2° C.

EVALUATION

With regard to temperature difference, Examples 1 to 3 exhibited smaller temperature differences than the respective Comparative Examples 1 to 3. That is to say, the temperature difference was reduced where the width of the electroconductive wires making up the connection circuit became broader from the second RF electrode toward the second RF terminal, as compared to a case of being constant at a narrow value. Also, the average temperature was closer to the target temperature (300° C.) where the connection circuit was formed of electroconductive wires in a mesh-patterned form as in Examples 1 and 2, as compared to a case of being formed of electroconductive wires in a radial form as in Example 3.

International Application No. PCT/JP2023/000526, filed on Jan. 12, 2023, is incorporated herein by reference in its entirety.

What is claimed is:

1. A wafer placement table, comprising:

a ceramic plate that has a wafer placement surface at an upper face thereof;

a first RF electrode that is circular and that is embedded in the ceramic plate;

a first RF terminal that is electrically connected to the first RF electrode;

a second RF electrode that is annular and that is positioned at an outer side of the first RF electrode in plan view, and that is embedded in the ceramic plate at a different depth from the first RF electrode;

a second RF terminal that is electrically connected to the second RF electrode; and a connection circuit that connects the second RF terminal and the second RF electrode, wherein the connection circuit is formed of electroconductive wires that are in a mesh-patterned form or in a radial form, and a width of the electroconductive wires becomes broader from the second RF electrode toward the second RF terminal.

2. The wafer placement table according to claim 1, wherein the second RF terminal is provided at the center of the ceramic plate.

3. The wafer placement table according to claim 1, wherein the width of the electroconductive wires becomes broader from the second RF electrode toward the second RF terminal, within a range of no less than 5 mm and no more than 15 mm.

4. The wafer placement table according to claim 1, wherein the connection circuit is formed of the electroconductive wires that are in a mesh-patterned form, and has apertures that are polygonal.

5. The wafer placement table according to claim 4, wherein innermost line segments of the electroconductive wires in the mesh-patterned form that are connected to the second RF terminal have widths that are broadest within the mesh-patterned form, and line segments of the electroconductive wires in the mesh-patterned form next closest to the second RF terminal after the innermost line segments are less broad than the innermost line segments but broader than any other line segments of the electroconductive wires in the mesh-patterned form.

\* \* \* \* \*